United States Patent
Kumagai

(10) Patent No.: US 7,242,610 B2
(45) Date of Patent: Jul. 10, 2007

(54) ULTRAVIOLET ERASABLE SEMICONDUCTOR MEMORY DEVICE

(75) Inventor: Yukihisa Kumagai, Hashima (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 162 days.

(21) Appl. No.: 11/053,851

(22) Filed: Feb. 10, 2005

(65) Prior Publication Data

US 2005/0232026 A1 Oct. 20, 2005

(30) Foreign Application Priority Data

Feb. 25, 2004 (JP) .............................. 2004-050362

(51) Int. Cl.
*G11C 16/04* (2006.01)
*G11C 17/00* (2006.01)
(52) U.S. Cl. ................. 365/185.01; 365/104; 365/184; 365/186
(58) Field of Classification Search ............ 365/185.01
See application file for complete search history.

(56) References Cited

U.S. PATENT DOCUMENTS

| 5,053,841 | A | * | 10/1991 | Miyakawa et al. ......... 257/318 |
| 5,089,866 | A | * | 2/1992 | Iwasa ........................... 257/69 |
| 5,331,597 | A | * | 7/1994 | Tanaka ................... 365/185.24 |
| 5,677,867 | A | * | 10/1997 | Hazani ................... 365/185.01 |
| 5,930,180 | A | * | 7/1999 | Callahan ................ 365/189.09 |
| 6,618,282 | B1 | * | 9/2003 | Poplevine et al. ............ 365/94 |

* cited by examiner

*Primary Examiner*—Son L. Mai
(74) *Attorney, Agent, or Firm*—Oliff & Berridge, PLC

(57) ABSTRACT

Each memory cell of an EPROM contains two MOSFETs and a data of each memory cell is read out by detecting a current difference between the two MOSFETs by using a differential amplifier. In such constitution as described above, even when the data is erased by irradiating an ultraviolet ray, a stable output of the differential amplifier can be obtained and, therefore, confirmation of an initialized state can be facilitated. Specifically, a channel width $W_A$ of one of the two MOSFETs constituting the memory cell is formed narrower than a channel width $W_B$ of the other. By such arrangement as described above, in an initialized state in which the ultraviolet ray is irradiated, a data signal current value $I_{HA}$ of the MOSFET having the channel width $W_A$ becomes smaller than a data signal current value $I_{HB}$ flowing in the MOSFET having the channel width $W_B$. Accordingly, the output of the differential amplifier is fixed in accordance with a current magnitude relation of $I_{HA} < I_{HB}$, to thereby define a data "0". On the other hand, in writing a data "1", charges are injected in a floating gate electrode of the MOSFET having the channel width $W_B$ to raise a threshold voltage Vt and, then, the MOSFET is set in an "off" state.

11 Claims, 2 Drawing Sheets

ULTRAVIOLET ERASABLE SEMICONDUCTOR MEMORY DEVICE

CROSS-REFERENCE TO RELATED APPLICATIONS

The priority application Number JP2004-050362 filed Feb. 25, 2004, upon which this patent application is based is hereby incorporated by reference.

FIELD OF THE INVENTION

The present invention relates to an ultraviolet erasable semiconductor memory device capable of erasing stored data by irradiating an ultraviolet ray.

BACKGROUND OF THE INVENTION

In semiconductor memory devices, there is an EPROM (Erasable Programmable Read Only Memory) which can not only electrically write data but also erase the data by irradiating an ultraviolet ray on a transistor holding the data. Ordinarily, a semiconductor has memory cells which each store 1-bit data are arrayed in a matrix and can perform a data writing operation and a data reading operation for a memory cell in a designated position, for example, by designating a row and a column by using an address decoder. For example, a word line of each memory cell is connected to a Y address decoder and, then, the Y address decoder applies a row selection signal to the word line corresponding to an inputted Y address. On the other hand, a bit line of each memory cell is connected to an X address decoder and, then, the X decoder inputs data from outside to the bit line corresponding to an inputted X address or transmits the data from the bit line to an output circuit.

In the EPROM, a threshold voltage Vt of an FET is changed by injecting charges into a floating gate electrode or the like provided on a channel of an MOSFET (Metal-Oxide-Semiconductor Field Effect Transistor) via a gate oxide film. Since once-injected charges are held for a long period of time, data can be stored by a difference of the Vt. On the other hand, the charges can be discharged by irradiating the ultraviolet ray on the floating gate electrode and, by such discharging, the data can be erased.

A conventional EPROM is provided with one piece of such MOSFET as described above per memory cell. By applying a selection signal to a gate electrode (control gate electrode) of the MOSFET via a word line, the data written in the memory cell is read out on a bit line as a current in accordance with the Vt. An output circuit compares the thus-read out current with a given reference value and judges whether the data is "0" or "1".

On this occasion, injection of the charges into the floating gate electrode is performed by applying a high voltage between the control gate electrode connected to the word line and a drain diffusion layer connected to the bit line and, then, allowing the charges flowing out of the drain to have a high energy. Therefore, same charges as majority carriers of the drain are injected into the floating gate electrode. As a result, the thus-injected charges have an effect to shield a potential fluctuation which the control gate electrode puts on a channel and, then, the Vt of the MOSFET in a charge injected state becomes higher than that in a state of being not injected with the charges and, therefore, a data signal current read out into the output circuit becomes relatively small in quantity.

In a data detecting method in which, as described above, the data signal current read out from the memory cell via the bit line is compared with the predetermined reference value in the output circuit, it was necessary to provide a comparatively large margin for variance, fluctuation or the like among data signal currents. In contrast, considered is a constitution in which 2 pieces of the above-described MOSFETs capable of writing data are provided per memory cell and, then, a Vt of one of the MOSFETs which is selected in accordance with data to be written in the memory cell is allowed to be changed by injecting charges. In this constitution, for example, a Tr 1 and a Tr 2 are provided as 2 MOSFETs and, then, the charges are injected only into the Tr 1 against a data value "1" while only into the Tr 2 against a data value "0". By such operations as described above, the Vt of one of the MOSFETs is set higher while that of the other lower and, then, a magnitude relation between data signal currents flowing in respective MOSFETs is shifted in accordance with data values. When a difference of the magnitude relation can be detected by the differential amplifier, there is a merit in that the margin against the above-described variation, fluctuation or the like among individual data signal currents can be made small.

However, in a state in which data is erased by ultraviolet ray irradiation, that is, in an initialized state, since Vts of two MOSFETs are same with each other, a given value can not be obtained in an output of the differential amplifier. For this account, there is caused an inconvenience in that it is difficult to confirm whether the data is erased or not (or whether used or not used). Then, when the MOSFET constituting the memory cell is such a type capable of electrically erasing or rewriting data as is used in a flash memory, it is possible to previously write an initializing data at a manufacturer's side before shipment such that the output of the differential amplifier does not become unstable. However, in order to erase the data in the EPROM, it is necessary to irradiate the ultraviolet ray thereon and, once the initializing data is written, it is difficult that a user rewrites the initial data and, then, stores a desired data. Therefore, the above-described inconvenience is an intrinsic problem in the ultraviolet erasable semiconductor memory device.

SUMMARY OF THE INVENTION

The present invention solves the above-described problems and has an object of preventing an output of a differential amplifier from being unstable in an initialized state and, then, facilitating confirmation of the initialized state at a user's side in an ultraviolet erasable semiconductor memory device comprising a memory cell comprising two MOSFETs and detecting a difference of data signal current therebetween by using the differential amplifier.

An ultraviolet erasable semiconductor memory device according to the present invention comprises a memory cell comprising a pair of transistors of field effect type to be selected by a common selection signal and a differential amplifier which reads out 1-bit data recorded in the memory cell based on a magnitude relation between respective data signal currents drawn out from the pair of transistors, in which the pair of transistors have therebetween a predetermined signal current difference between respective data signal currents in a state in which the data in the memory cell is erased.

DESCRIPTION OF THE PREFERRED EMBODIMENTS

Figure 1:
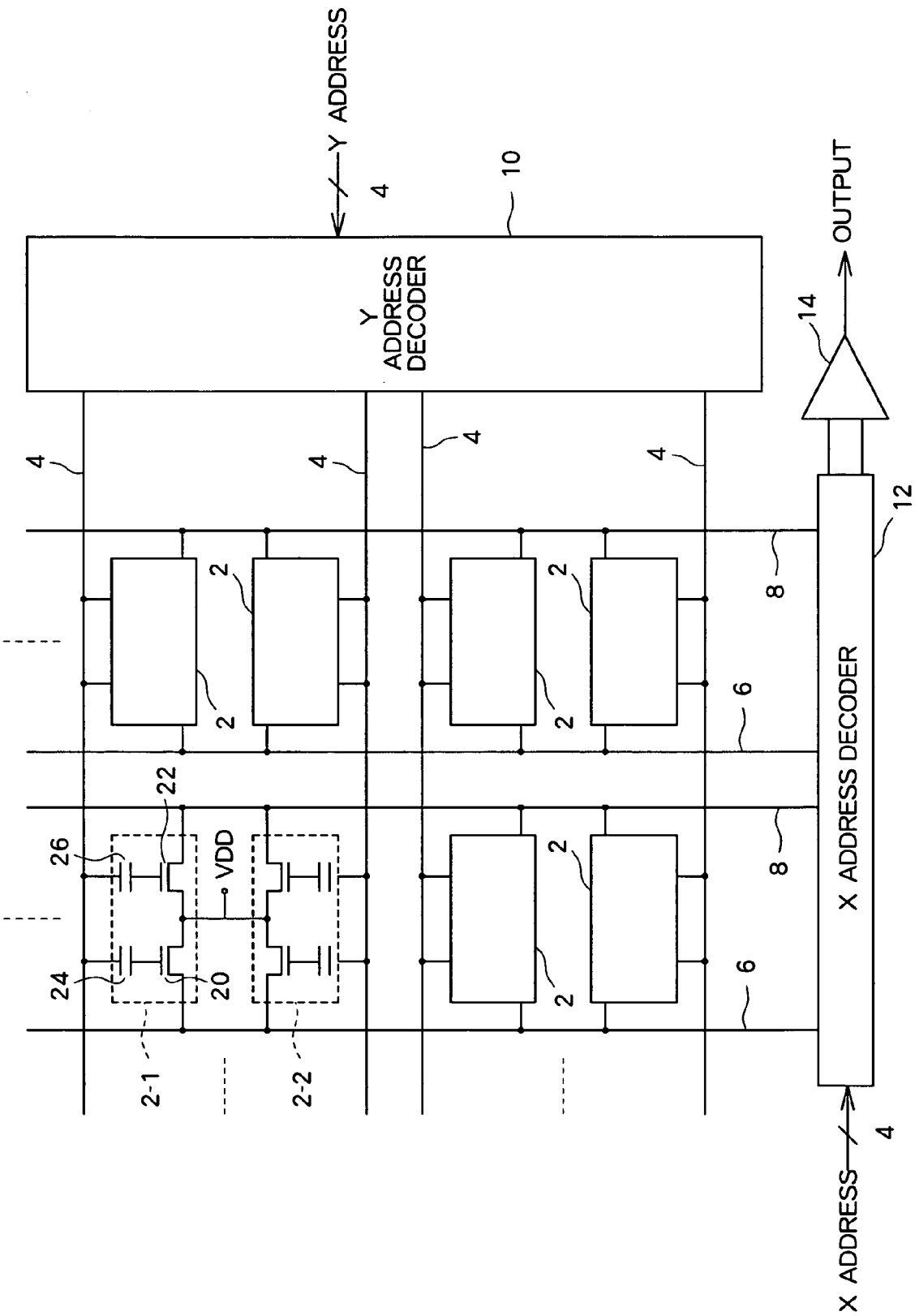
FIG. 1 is a schematic circuit constitution view of an EPROM according to an embodiment of the present invention.

Firstly, a fundamental aspect of an ultraviolet erasable semiconductor memory device which is a preferred embodiment according to the present invention is outlined.

As a fundamental constitution, the ultraviolet erasable semiconductor memory device according to an embodiment of the present invention comprises a memory cell comprising a pair of transistors of field effect type to be selected by a common selection signal and a differential amplifier which reads out data recorded in the memory cell based on a magnitude relation between respective data signal currents drawn out from the pair of transistors, in which the pair of transistors have therebetween a predetermined signal current difference between respective data signal currents in a state in which the data in the memory cell is erased.

In the present memory device, a pair of transistors provided in a memory cell are set in a state in which channel currents (data signal currents) thereof are different from each other in accordance with the fact whether or not charges are injected to a floating gate electrode or the like. On the other hand, discharge or the like of the thus-injected charges is performed by irradiating an ultraviolet ray and, then, the data signal currents are each allowed to be in an initialized state. A difference between two data signal currents of the pair of transistors is set in accordance with 1-bit data stored in the memory cell and, when the difference is detected by a differential amplifier, the data is read out. In the present memory device, the pair of transistors provided in each of the memory cells are constituted such that data signal currents flowing in respective transistors are different from each other in an initialized state in which charges are not injected in these transistors at all.

For example, the present memory device comprises a memory cell comprising a pair of transistors made up of a first transistor and a second transistor to be selected by a common selection signal, and a differential amplifier which reads out data recorded in the memory cell based on a magnitude relation between respective data signal currents drawn out from the first transistor and the second transistor, in which the first transistor generates, in a state in which the data in the memory cell is erased, the data signal current larger by a predetermined signal current difference than the second transistor and, then, after charges are injected into a floating gate electrode in accordance with the data written in the memory cell, generates the data signal current smaller than the second transistor in a state in which the charges are injected.

Out of two transistors in a pair, one transistor in which the data signal current in an initialized state is small is defined as a second transistor while the other in which the data signal current in the initialized state is large is defined as a first transistor and the data signal currents thereof are defined as $I_{H2}$ and $I_{H1}$ ($I_{H1} > I_{H2}$), respectively. Further, the data signal current in a state in which charges are injected in the first transistor is defined as $I_{L1}$. The present memory device is constituted such that a relation of $I_{H1} > I_{H2} > I_{L1}$ is established, namely, $I_{H2}$ comes to be at an intermediate level between $I_{H1}$ and $I_{L1}$.

For example, the pair of transistors in the present memory device each have a different channel width from each other and generate the signal current difference based on such difference of the channel width.

For example, the pair of transistors in the present memory device each have a different channel length from each other and generate a signal current difference based on such difference of the channel length.

For example, the pair of transistors in the present memory device each have an insulation film having a different thickness from each other between a channel and a floating gate electrode and generate a signal current difference based on such difference of the thickness of the insulation film.

For example, the pair of transistors in the present memory device each have a different electrostatic capacity from each other between the floating gate electrode and a control gate electrode which is applied with the selection signal and generate a signal current difference based on such difference of the electrostatic capacity.

According to the present memory device, since data signal currents flowing in the two transistors provided in each of the memory cells are different from each other in an initialized state, the output of the differential amplifier is prevented from being unstable.

For example, in the present memory device comprising a plurality of memory cells, respective data readout from the plurality of memory cells in a state in which the data are erased are same with one another on all of the memory cells.

The fundamental aspect of the ultraviolet erasable semiconductor memory device which is a preferred embodiment according to the present invention has so far been outlined. Next, embodiments according to the invention are specifically described in detail with reference to drawings.

FIG. 1 is a schematic circuit constitution view of an EPROM according to an embodiment of the present invention. On this occasion, a constitution capable of storing 256-bit data is illustrated. A memory cell 2 is provided per bit of the data and such memory cells are two dimensionally arrayed in 16 rows×16 columns. Upper 4 bits of an address of 8 bits are defined as a Y address and lower 4 bits there of are defined as an X address and, then, the Y address designates a row position of a memory cell array while the X address a column position thereof.

Each memory cell 2 has a same constitution of a circuit as shown in a memory cell 2-1 or 2-2. Each memory cell 2 is connected to one word line 4 and two bit lines 6 and 8 and receives a supply from a power supply VDD. The Y address is inputted in a Y address decoder 10 which, then, applies a predetermined voltage to a word line designated by the Y address as a row selection signal. On the other hand, the X address is inputted in an X address decoder 12 which, then, allows a pair of bit lines 6 and 8 which are connected to a row of the memory cell 2 at the position designated by the X address to have a low impedance.

The memory cell 2 has two MOSFETs 20 and 22 which each have a control gate electrode connected to the word line, a floating gate electrode capable of being injected with charges and holding the thus-injected charges, a source connected to the power supply VDD, and a drain connected to the bit line. In the illustrated MOSFETs 20 and 22, the control gate electrode and the floating gate electrode are in capacity coupling therebetween and, in FIG. 1, capacitors 24 and 26 show the capacity coupling. When the MOSFETs 20 and 22 are each an n-MOS, the VDD is set to have a ground potential.

In an operation of writing into the memory cell 2, charges can be injected to the floating gate electrode of one of the MOSFETs. The floating gate electrode is an independent electrode insulated from other components, fundamentally holds the thus-injected charges therein unless an erasure operation by irradiating the ultraviolet ray is conducted and shifts a potential of the electrode to either a positive side or a negative side. On the other hand, the potential of the floating gate electrode which is not injected with charges is held neutral. Charges to be injected are electrons when the MOSFETs 20 and 22 are each an n-MOS and, on this occasion, the potential of the floating gate electrode is shifted to the negative side. By the charges thus injected in the floating gate electrode, an electric field which the control gate electrode puts on the channel is shielded and, accordingly, the threshold voltage Vt of the MOSFET is raised.

When the MOSFETs 20 and 22 are each constituted by an n-MOS, a predetermined positive voltage is applied to the word line as a row selection signal. An influence of a potential change of the control gate electrode to be caused by such voltage application is put on the channels of the MOSFETs 20 and 22 of the memory cell 2 connected to the word line via the floating gate electrode. On this occasion, in order to allow the floating gate electrode which has been injected with charges to shield the influence of the row selection signal, a corresponding MOSFET is held in an "off" state. On the other hand, the MOSFET in which charges have not been injected in the floating gate electrode comes to be in an "on" state in response to the potential change of the control gate electrode.

When the bit line connected to the MOSFET in the "on" state is selected by the X address decoder 12, a current flows in the MOSFET and is drawn out as a data signal current via the bit line. On the other hand, in the MOSFET in the "off" state, even when the bit line which is connected to the MOSFET is selected by the X address decoder 12, a current does not flow in the channel and, accordingly, the data signal current on the bit line comes to be nearly "0".

As has been described above, the data signal currents are drawn out from the MOSFETs 20 and 22 of the memory cell 2 in such row and column as selected by the Y address decoder 10 and the X address decoder 12 and the thus-drawn out data signal currents are introduced into input ends of a differential amplifier 14 via bit lines 6 and 8. In the differential amplifier 14, the data signal current from the bit line 6 is inputted in one input end while that from the bit line 8 is inputted in the other input end and, then, 1-bit data stored in the memory cell 2 thus selected is read out based on a difference between these data signal currents.

Figure 2:
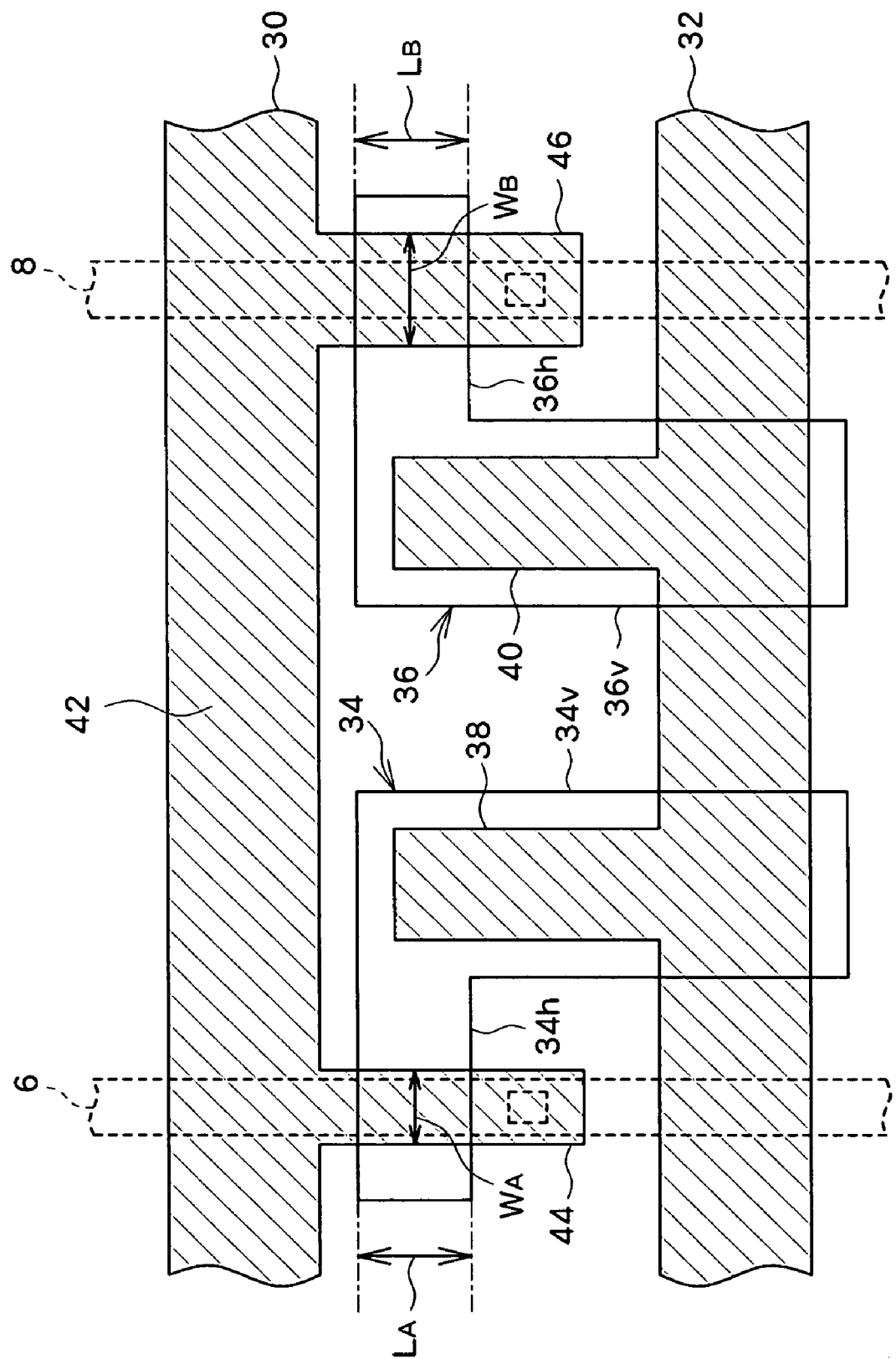
FIG. 2 is a schematic plan view of a memory cell of the EPROM according to the embodiment.

FIG. 2 is a schematic plan view of a memory cell 2 of an EPROM according to the embodiment, in which MOSFET 20 is formed in a left half portion thereof, while MOSFET 22 in a right half portion thereof. For example, active regions 30 and 32 each in a comb-like shape extending in a direction along a row (shown horizontally in FIG. 2) are formed on a silicon substrate containing a p-type impurity. The active regions 30 and 32 are realized by forming a local oxide film (LOCOS) in other portions than these regions. In the active region 32, an impurity region having a low resistance is formed by doping the n-type impurity in a high concentration and the thus-formed impurity region is allowed to be a word line 4.

Floating gate electrodes 34 and 36 are formed such that they are lapped over projected portions corresponding to teeth of the comb-like shape of the active region 32. For example, the floating gate electrodes 34 and 36 are formed each in an L shape and lapped over the active region 32, as described above, by vertical portions 34v and 36v of the L shape; on the other hand, horizontal portions 34h and 36h of the L shape are arranged such that they cross over the projected portions of the active region 30. The floating gate electrodes 34 and 36 are formed by, for example, polysilicon and, then, each provided with an insulation film such as an oxide film which intervenes between the floating gate electrodes and each of respective active regions and, accordingly, as described above, they are formed as isolated electrodes. The vertical portions 34v and 36v of the floating gate electrodes 34 and 36 are in capacity coupling with impurity regions of the active region 32 via respective oxide films, to thereby form capacitors 24 and 26. And, the impurity regions of the active region 32 which are lapped with these vertical portions 34v and 36v function as control gate electrodes 38 and 40, respectively.

Further, in a portion of the active region 30 which is not covered with the floating gate electrodes 34 and 36, an impurity region having a low resistance is formed by being doped with an n-type impurity in a high concentration. A portion extending in a horizontal direction within the impurity region is connected to a power supply VDD as a source region 42. On the other hand, tip end portions of the projected portions of the active region 30 within the impurity region become drain regions 44 and 46.

Bit lines 6 and 8 are arrayed in the vertical direction along the row and the bit lines 6 and 8 are in ohmic-contact with the drain regions 44 and 46 via a contact, respectively. For example, the bit lines 6 and 8 are formed by using tungsten.

In such configuration as described above, channel widths $W_A$ and $W_B$ of respective MOSFETs 20 and 22 are defined by widths of the projected portions of the active region 30 at portions overlapped with the horizontal portions 34h and 36h of the floating gate electrodes, while channel lengths $L_A$ and $L_B$ thereof are defined by widths of the horizontal portions 34h and 36h of the floating gate electrodes at portions overlapped with the projected portions of the active portion 30.

Major characteristic of the present device is in a point in that the present device is constituted such that, in an initialized state in which charges are not injected in the floating gate electrodes 34 and 36, when the MOSFETs 20 and 22 are selected by the Y address decoder 10 and the X address decoder 12, data signal currents $I_{HA}$ and $I_{HB}$ flowing therein are different from each other. In an example as shown in FIG. 2, as a constitution of realizing such characteristic as described above, the MOSFETs 20 and 22 are formed such that the channel $W_A$ and $W_B$ satisfy a relation of $W_A < W_B$. By such formation as described above, $I_{HA} < I_{HB}$ is established.

Next, an operation of the present EPROM is described. Firstly, a data writing operation is described. By constitutions of the MOSFETs 20 and 22 described above, a relation of $I_{HA} < I_{HB}$ can fundamentally be set in each memory cell 2 in an initialized state and a given output level can be obtained in an output of a differential amplifier 14 for each memory cell 2. On this occasion, the output of the differential amplifier 14 in the initialized state is defined as data "0". A user can easily recognize that the EPROM is in an initialized state based on the fact that the data read out from each memory cell 2 of the present EPROM into which the user newly writes data is "0".

In data writing into the memory cell 2, a charge injection operation into a floating gate electrode of one of the MOSFETs of memory cell 2 can be performed. In such charge injection, a Y address decoder 10 selects a word line 4 corresponding to the memory cell 2 containing the MOSFET in which charges are injected into the floating gate electrode and an X address decoder 12 selects a bit line corresponding to the MOSFET at the side of charge injection from two bit lines corresponding to the memory cell 2. A high voltage (for example, in the range of from 10 to 20 V) is applied between a control gate electrode of the thus-selected MOSFET and a drain region, to thereby allow a current to flow in a channel of the MOSFET. By a capacity coupling between the control gate electrode and the floating gate electrode, a high voltage is also applied between the floating gate electrode and the drain region. A portion of electrons flowing in the MOSFET is accelerated by a high electric field in the vicinity of the drain region, gains energy and is injected in the floating gate electrode passing over an energy barrier of a gate insulation film. As described above, since the floating gate electrode is an isolated electrode, the floating gate electrode can hold the thus-injected charges for a long period of time.

In the present EPROM, when a data "1" is written in the memory cell 2, charges (electrons) are injected into the floating gate electrode 36 of the MOSFET 22 which has a large channel width to raise a threshold voltage Vt thereof higher than that of the MOSFET 20 which has a small channel width in a pair. By such arrangement as described above, a data signal current of the MOSFET 22 comes to have a lower value, that is, $I_{LB}$ which is lower than $I_{HA}$ and, then, a magnitude relation of data signal current between the MOSFETs 20 and 22 is reversed from the state of data "0". Further, by raising the Vt, the MOSFET 22 is ordinarily set in an "off" state even at the time of selection of the memory cell 2 and an expression: $I_{LB}=0$ is fundamentally established.

On one hand, in the present EPROM, a magnitude relation of the data signal current between the MOSFETs 20 and 22 of each memory cell 2 in an initialized state is, as described above, in a state of the data "0". Accordingly, by omitting the operation of writing "0", a speed of performing wiring processing can be raised. On the other, in order to realize a more stable and safer state of the data "0", an operation in reverse to the above-described operation of writing "1", namely, processing of injecting charges into the floating gate electrode 34 of the MOSFET 20 which has a small channel width to raise the Vt may be performed. On this occasion, the data signal current of the MOSFET 20 is changed to $I_{LA}$ which is lower than $I_{HA}$. Further, by raising the Vt, the expression: $I_{LA}=0$ is fundamentally established.

Next, an operation of reading out the data which has been written in as described above from the present EPROM is described. By designating an address, a row selection signal is applied in a word line 4 corresponding to a target memory cell 2 from which the data is read out and, at the same time, bit lines 6 and 8 corresponding to the memory cell 2 are each allowed to have a low impedance. From the memory cell 2 which holds the data "0", the data signal current $I_{HA}$ is drawn out on the bit line 6 while the data signal current $I_{HB}$ on the bit line 8. As described above, since the relation of $I_{HA}<I_{HB}$ is established, in correspondence with this magnitude relation, the differential amplifier 14 outputs a voltage level corresponding to the data "0". Further, when the data "0" is written in the memory cell 2 by injecting charges in the MOSFET 20, $I_{LA}$ is drawn out on the bit line 6.

On the other hand, from the memory cell 2 in which the data "1" is written, the data signal current $I_{HA}$ is drawn on the bit line 6 while the data signal current $I_{LB}$ on the bit line 8. As described above, since the relation of $I_{HA}>I_{LB}$ is established, in accordance with this magnitude relation, the differential amplifier 14 outputs a voltage level corresponding to the data "1".

Further, in the above-described constitution, by setting a difference of channel width between the MOSFETs 20 and 22, the data signal current $I_{HA}$ of the MOSFET 20 in an initialized state is set smaller than the data signal current $I_{HB}$ of the MOSFET 22 and, by such setting, the output of the differential amplifier 14 is prevented from being unstable in the initialized state. On this occasion, as for the constitution in which a difference of the data signal current in the initialized state is set, various types of other constitutions can be applied. An example of such other constitutions is to establish a relation of $L_A>L_B$, namely, to allow a channel length $L_A$ of the MOSFET 20 to be longer than a channel length $L_B$ of the MOSFET 22. Even by this constitution, in a same manner as in the above-described constitution which narrows a channel width, a channel resistance becomes larger in the MOSFET 20 than in the MOSFET 22 and, accordingly, the magnitude relation of $I_{HA}<I_{HB}$ can be established between the data signal currents $I_{HA}$ and $I_{HB}$ in the initialized state.

As for another example, there is a constitution in which the capacity coupling between the channel and the floating gate electrode is allowed to be different between two MOSFETs 20 and 22. For example, by allowing thickness of a gate oxide film between the active region and the floating gate electrode which constitute the channel to be thicker in the MOSFET 20 than in the MOSFET 22, the Vt of the MOSFET 20 can be raised compared with the MOSFET 22.

As for still another example, there is a constitution in which the capacity coupling between the floating gate electrode and the control gate electrode is allowed to be different between two MOSFETs 20 and 22. For example, an area in which the floating gate electrode 34 and the control gate electrode 38 are overlapped one on top of the other in the MOSFET 20 is formed to be smaller than that in the MOSFET 22. By such arrangement as described above, an influence which the row selection signal applied to the control gate electrode puts on the channel becomes small in the MOSFET 20 and, accordingly, the data signal current becomes smaller in the MOSFET 20 than in the MOSFET 22.

What is claimed is:

1. An ultraviolet erasable semiconductor memory device, comprising:
   a memory cell comprising a pair of transistors of field effect type to be selected by a common selection signal; and
   a differential amplifier which reads out data recorded in the memory cell based on a magnitude relation between respective data signal currents drawn out from the pair of transistors,
   wherein the pair of transistors have therebetween a predetermined signal current difference between respective data signal currents in a state in which the data in the memory cell is erased.

2. The ultraviolet erasable semiconductor memory device as set forth in claim 1,
   wherein the pair of transistors each have a different channel width from each other and generate a signal current difference based on such difference of the channel width.

3. The ultraviolet erasable semiconductor memory device as set forth in claim 1, wherein the pair of transistors each have a different channel length from each other and generate a signal current difference based on such difference of the channel length.

4. The ultraviolet erasable semiconductor memory device as set forth in claim 1, wherein the pair of transistors each have an insulation film having a different thickness from each other between a channel and a floating gate electrode and generate a signal current difference based on such difference of the thickness of the insulation film.

5. The ultraviolet erasable semiconductor memory device as set forth in claim 1, wherein the pair of transistors each have a different electrostatic capacity from each other between the floating gate electrode and a control gate electrode which is applied with the selection signal and generate a signal current difference based on such difference of the electrostatic capacity.

6. An ultraviolet erasable semiconductor memory device, comprising:

a memory cell comprising a pair of transistors made up of a first transistor and a second transistor to be selected by a common selection signal; and a differential amplifier which reads out data recorded in the memory cell based on a magnitude relation between respective data signal currents drawn out from the first transistor and the second transistor, wherein the first transistor generates, in a state in which the data in the memory cell is erased, the data signal current larger by a predetermined signal current difference than the second transistor and, then, after charges are injected into a floating gate electrode in accordance with the data written in the memory cell, generates the data signal current smaller than the second transistor while in a state in which the charges are injected.

7. The ultraviolet erasable semiconductor memory device as set forth in claim 6, wherein the pair of transistors each have a different channel width from each other and generate a signal current difference based on such difference of the channel width.

8. The ultraviolet erasable semiconductor memory device as set forth in claim 6, wherein the pair of transistors each have a different channel length from each other and generate a signal current difference based on such difference of the channel length.

9. The ultraviolet erasable semiconductor memory device as set forth in claim 6, wherein the pair of transistors each have an insulation film having a different thickness from each other between a channel and a floating gate electrode and generate a signal current difference based on such difference of the thickness of the insulation film.

10. The ultraviolet erasable semiconductor memory device as set forth in claim 6, wherein the pair of transistors each have a different electrostatic capacity from each other between the floating gate electrode and a control gate electrode which is applied with the selection signal and generate a signal current difference based on such difference of the electrostatic capacity.

11. An ultraviolet erasable semiconductor memory device, comprising:

a plurality of memory cells each comprising a pair of transistors of field effect type to be selected by a common selection signal; and a differential amplifier which reads out data recorded in the memory cells based on a magnitude relation between respective data signal currents drawn out from the pair of transistors, wherein respective data thus read out from the plurality of memory cells in a state in which the data are erased are same with one another on all of the memory cells.

* * * * *